United States Patent
Moon (10) Patent No.: US 6,423,580 B2
(45) Date of Patent: Jul. 23, 2002

(54) METHOD FOR MANUFACTURING A DUAL CHIP PACKAGE

(75) Inventor: Sung-Chun Moon, Chungcheongnam-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/919,621

(22) Filed: Jul. 30, 2001

(30) Foreign Application Priority Data

Aug. 14, 2000 (KR) .......................................... 00-046944

(51) Int. Cl.$^7$ .................... H01L 21/44; H01L 21/48; H01L 21/50
(52) U.S. Cl. .................. 438/123; 438/118; 438/119; 438/121
(58) Field of Search ................... 438/118, 119, 438/121, 123

(56) References Cited

U.S. PATENT DOCUMENTS 6,224,360 B1 * 5/2001 Miyajima ..................... 425/89

FOREIGN PATENT DOCUMENTS

JP 4-326535 * 11/1992

* cited by examiner

Primary Examiner—David Zarnela
Assistant Examiner—David A. Zarneke
(74) Attorney, Agent, or Firm—Marger Johnson & McCollom, P.C.

(57) ABSTRACT

The present invention discloses a method of manufacturing a dual chip package using tape wiring boards. According to the method, an upper tape wiring board, a lower tape wiring board, and a lead frame are prepared. Each of the tape wiring boards includes a polymeric tape having windows patterned therein, metal patterns formed on the lower surface of the polymeric tape at either sides of said windows. The metal patterns have pad connection portions exposed through the window. Lead connection portions extend outwardly from said polymeric tape. An adhesive layer is formed on the lower surface of the tape. A lower chip is attached to a lower surface of the die pad. The lower chip includes an active surface having a plurality of electrode pads at approximately the center and a rear surface attached to the lower surface of the die pad. An upper chip is attached to an upper surface of the die pad. The upper chip includes an active surface having a plurality of electrode pads at approximately the center and a rear surface attached to the upper surface of the die pad. Each of the adhesive layers of the upper tape wiring board and the lower tape wiring board is attached to a respective one of the active surfaces of the upper chip and the lower chip. The windows of the lower and upper tape wiring boards expose the electrode pads of the lower and upper chips, respectively. Each of the pad connection portions is attached to a respective one of the electrode pads. Each of the lead connection portions is attached to a respective one of the inner leads. Next, the upper chip, the lower chip, the upper wiring board, and the lower wiring board are encapsulated to form a package body.

13 Claims, 6 Drawing Sheets

METHOD FOR MANUFACTURING A DUAL CHIP PACKAGE

BACKGROUND OF THE INVENTION

1. Field of the Invention

The present invention relates to a method for manufacturing semiconductor device packages and, more particularly, to a method for manufacturing dual chip packages (DCP) comprising two semiconductor chips.

2. Description of the Related Arts

Recently, semiconductor packaging technologies have been developed to satisfy demands for high density, increased capacity and miniaturization in the semiconductor industry. Particularly, multi-chip packages containing numerous semiconductor chips have been introduced and widely employed in assembly processes. One such approach is a stack package on which plural bare chips are three-dimensionally stacked in a single package.

Figure 1:
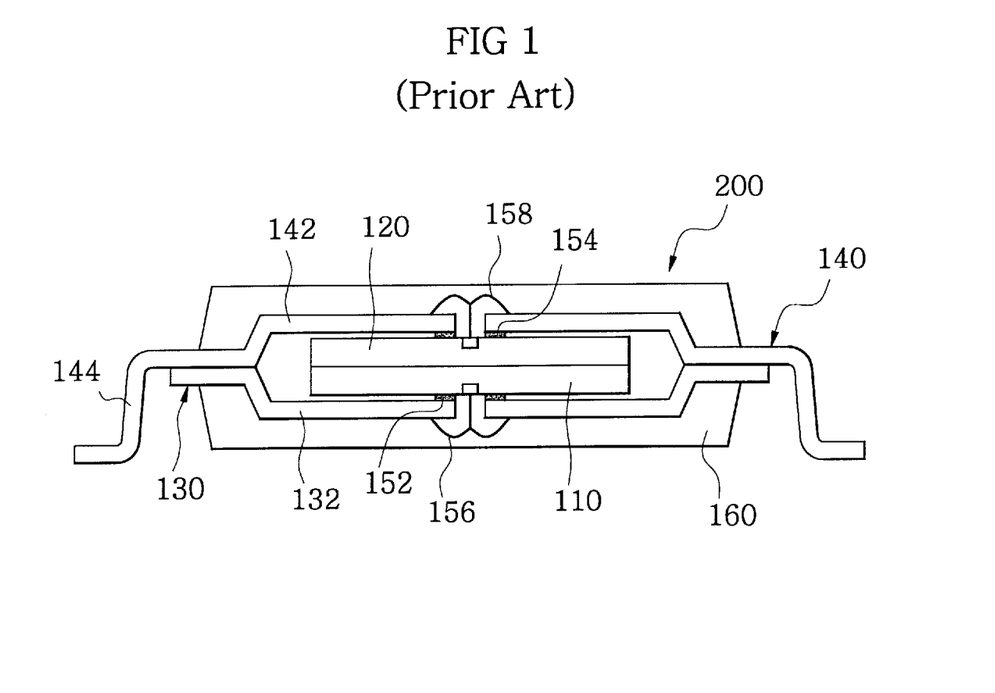
FIG. 1 is a cross-sectional view showing a conventional dual chip package.

FIG. 1 shows a conventional dual chip package 200 comprising two semiconductor chips, that is, a lower chip 110 and an upper chip 120. Herein, a lead frame on which the lower chip 110 is mounted, is referred to as a lower lead frame 130, and a lead frame on which the upper chip 120 is mounted, is referred to as an upper lead frame 140.

The lower chip 110 and the upper chip 120 are respectively mounted on and electrically wire-bonded to the lower lead frame 130 and the upper lead frame 140. The lower chip 110 and the upper chip 120 are center pad-type chips having electrode pads at the center of the active surface. The lower chip 110, the upper chip 120, the lower lead frame 130, the upper lead frame 140, and electrical connection portions including the bonding wire are all molded with a molding resin to form a package body 160.

Because the dual chip package 200 comprises two vertically stacked semiconductor chips 110, 120 and two vertically stacked lead frames 130, 140, its thickness is limited by the vertical dimension of these elements. It is especially difficult to manufacture a dual chip package having a thickness of about 1,000 mm. Therefore, the overall thickness of the semiconductor chip and the lead frame needs to be minimized. However, extreme processing in the thickness of the semiconductor chip causes cracks in or damage to the semiconductor chip. Extreme processing in the thickness of the lead frame reduces the reliability of the wire bonding due to deformation of terminals of the inner leads. So, there are limits that the conventional DCP structure can achieve on reducing the thickness of the semiconductor chip and the lead frame.

Since lower bonding wires 156 and upper bonding wires 158 are respectively arranged over the lower surface of the lower lead frame 130 and the upper surface of the upper lead frame 140, the conventional DCP 200 has a drawback in that the lower bonding wires 156 and the upper bonding wires 158 easily extrude from the package body 160.

The inner leads 142 of the upper lead frame 140 and the inner leads 132 of the lower lead frame 130 are aligned and attached to each other by thermocompression method, and therefore attachment technique having high reliability is required. And, the lower bonding wires 156 extruding from the lower surface of the lower chip 110 are easily damaged during the manufacturing process.

Further, a step of removing the outer leads (not shown) from the lower lead frame 130 is further required.

SUMMARY OF THE INVENTION

Accordingly, an object of the present invention is to provide a method of manufacturing dual chip packages, which implements a thinner profile by mounting two chips on both sides of a single lead frame.

Another object of the present invention is to prevent package failures due to bonding wires.

In order to achieve the foregoing and other objects, the present invention provides a method of manufacturing a dual chip package using tape wiring boards.

According to the method, an upper tape wiring board, a lower tape wiring board, and a lead frame are provided. Each of the tape wiring boards includes a polymeric tape having windows patterned therein, metal patterns formed on the lower surface of the polymeric tape at either sides of said windows. The metal patterns have pad connection portions exposed through the window. Lead connection portions extend outwardly from said polymeric tape. An adhesive layer is formed on the lower surface of the tape. A lower chip is attached to a lower surface of the die pad. The lower chip includes an active surface having a plurality of electrode pads at approximately the center and a rear surface attached to the lower surface of the die pad. An upper chip is attached to an upper surface of the die pad. The upper chip includes an active surface having a plurality of electrode pads at approximately the center and a rear surface attached to the upper surface of the die pad. Each of the adhesive layers of the upper tape wiring board and the lower tape wiring board is attached to a respective one of the active surfaces of the upper chip and the lower chip. The windows of the lower and upper tape wiring boards expose the electrode pads of the lower and upper chips, respectively. Each of the pad connection portions is attached to a respective one of the electrode pads. Each of the lead connection portions is attached to a respective one of the inner leads. Next, the upper chip, the lower chip, the upper wiring board, and the lower wiring board are encapsulated to form a package body.

BRIEF DESCRIPTION OF THE DRAWINGS

The above objectives and advantages of the present invention will become more apparent by describing in detail a preferred embodiment thereof with reference to the attached drawings in which:

FIG. 3 through FIG. 10 illustrate each step of a method of manufacturing the dual chip package in accordance with an embodiment of the present invention;

DETAILED DESCRIPTION OF THE PREFERRED EMBODIMENTS

Preferred embodiments of the present invention will be described below with reference to the accompanying drawings.

Figure 2:
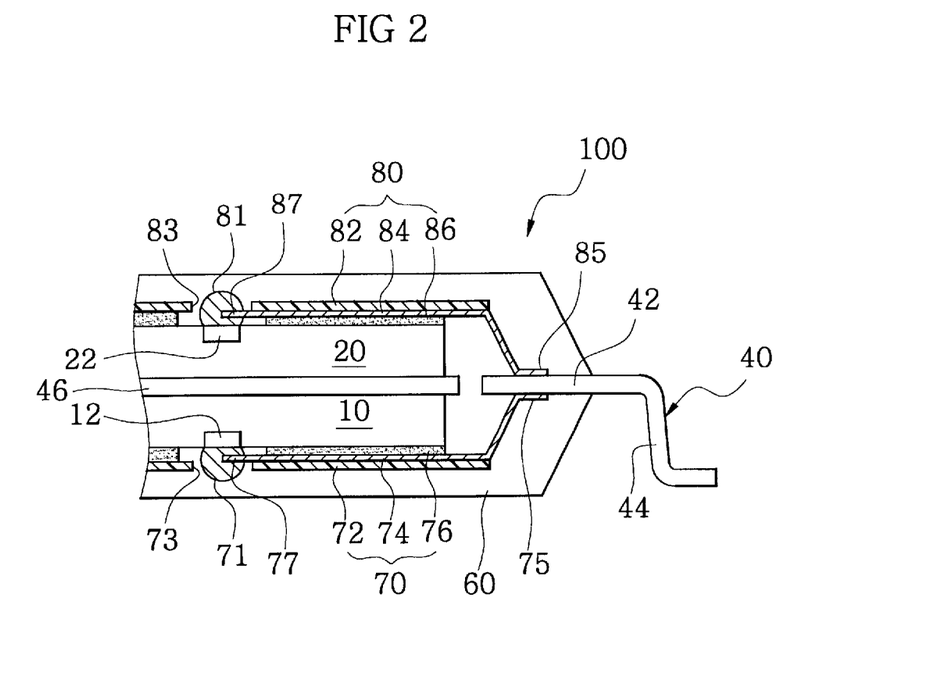
FIG. 2 is a cross-sectional view showing a dual chip package in accordance with an embodiment of the present invention.

FIG. 2 is a cross-sectional view showing a dual chip package 100 in accordance with one embodiment of the present invention. The dual chip package 100 comprises a lead frame 40, a lower chip 10, an upper chip 20, a lower tape wiring board 70, an upper tape wiring board 80, and a package body 60.

The lead frame 40 comprises a die pad 46, a plurality of inner leads 42 extending toward, preferably coplanar with, the die pad 46, and a plurality of outer leads 44 integrated with the inner leads 42 and extruding from the package body 60. Herein, the outer leads 44 are preferably bent in a gull-wing shape.

The lower chip 10 comprises an active surface having a plurality of electrode pads 12 at approximately the center, and a rear surface attached to the lower surface of the die pad 46. The upper chip 20 also comprises an active surface having a plurality of electrode pads 22 at approximately the center, and a rear surface attached to the upper surface of the die pad 46. In case of using the lower chip 10 and the upper chip 20, which are the same as each other, the lower chip 20 and the upper chip 20 are symmetrical to each other.

The lower tape wiring board 70 is attached to the active surface of the lower chip 10 and electrically connects the electrode pads 12 of the lower chip 10 to the inner leads 42. The upper tape wiring board 80 is attached to the active surface of the upper chip 20 and electrically connects the electrode pads 22 of the upper chip 20 to the inner leads 42.

The lower chip 10, the upper chip 20, the lower tape wiring board 70, the upper tape wring board 80, and the inner leads 46 are encapsulated with a liquid molding resin to form the package body 60.

The upper tape wiring board 80 comprises a polymeric tape, for example, a polyimide tape 82, conductive patterns, e.g., metal patterns 84, and an adhesive layer 86. A plurality of windows 83 are formed through the polyimide tape 82, so that each of the windows 83 corresponds to (expose) a respective one of the electrode pads 22. The metal patterns 84 are formed on the lower surface of the polyimide tape 82 at either side of the windows 83. The metal patterns 84 comprise one terminals extending over the windows 83 and serving as pad connection portions 87 electrically connected to the electrode pads 22. The other terminals extruding from the polyimide tape 82 and serving as lead connection portions 85 are attached to the inner leads 42. The adhesive layer 86 is a non-conductive adhesive and attaches the lower surface of the polyimide tape 82 to the active surface of the upper chip 20. Preferably, a double-sided adhesive polyimide tape or a liquid non-conductive adhesive is used as the adhesive layer 86.

Each of the pad connection portions 87 exposed through the window 83 is electrically connected to a respective one of the electrode pads 22 through a corresponding pad connection terminal 81. The pad connection terminals 81 are preferably made of conductive materials such as gold (Au), solder, nickel (Ni), or silver (Ag).

The lower tape wiring board 70 comprises a polyimide tape 72, metal patterns 74, and an adhesive layer 76. A plurality of windows 73 are formed through the polyimide tape 72, so that each of the windows 73 corresponds to (exposes) a respective one of the electrode pads 12. The metal patterns 74 are formed on the lower surface of the polyimide tape 72 on either side of the windows 73. The metal patterns 74 comprise one terminals extending over the windows 73 and serving as pad connection portions 77 attached to the electrode pads 12, and the other terminals extending outwardly from the polyimide tape 72 and serving as lead connection portions 75 attached to the inner leads 42. The adhesive layer 76 is a non-conductive adhesive and attaches the lower surface of the polyimide tape 72 to the active surface of the lower chip 10. Preferably, a double-sided adhesive polyimide tape or a liquid non-conductive adhesive is used as the adhesive layer 86.

Each of the pad connection portions 77 exposed from the window 73 is electrically connected to a respective one of the electrode pads 12 by a corresponding pad connection terminal 71. The pad connection terminals 71 are also made of conductive material such as gold (Au), solder, nickel (Ni), or silver (Ag).

In the dual chip package 100, the lower chip 10 and the upper chip 20 are arranged on the lower surface and the upper surface of the die pad 46 of a single lead frame 40, respectively. The electrode pads 12 or 22 of the lower chip 10 or the upper chip 20 are electrically connected to the inner leads 42 through the lower tape wiring board 70 or the upper tape wiring board 80 instead of bonding wires. Therefore, the minimized package 100 with a thinner profile can be manufactured by using thinner tape wiring boards 70, 80. Further, package failures due to damaged bonding wires can be prevented.

A method for manufacturing the dual chip package is described below in reference with FIG. 3 through FIG. 10.

Figure 3:
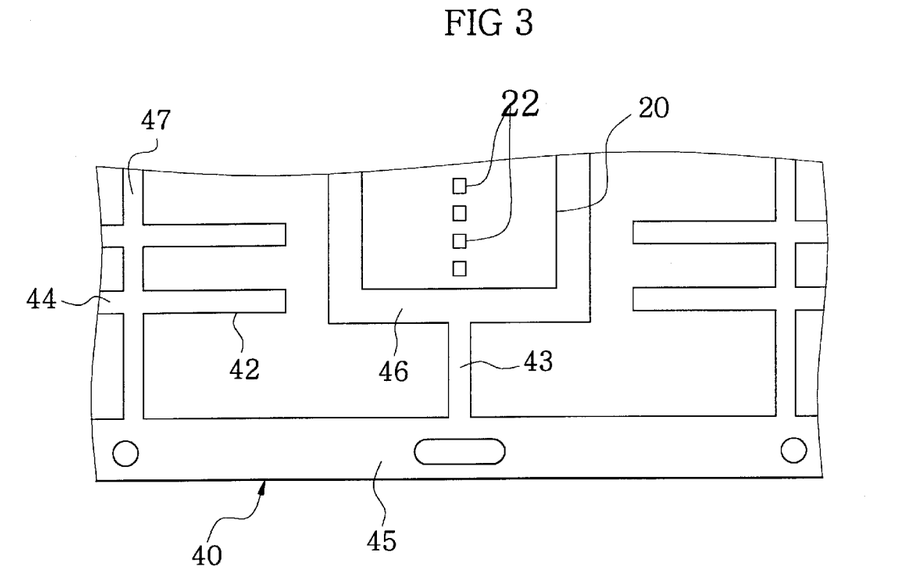
FIG. 3 is a plan view showing a lead frame of which an upper chip is attached to a die pad.
Figure 4:
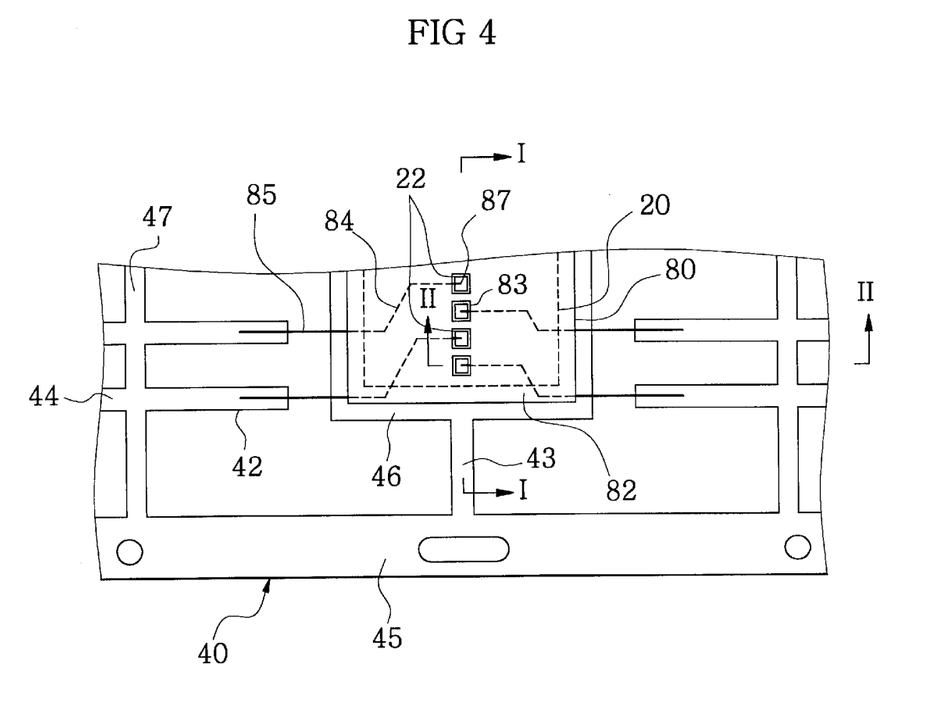
FIG. 4 is a plan view showing a lead frame on which an upper wiring board is attached to an active surface of the upper chip.

First, the manufacturing process of the dual chip package 100 starts with preparing the lead frame (40 in FIG. 3) and the tape wiring board (80 in FIG. 4).

As shown in FIG. 3, the lead frame 40 comprises the die pad 46, a plurality of inner leads 42 extending toward the die pad 46, and a plurality of outer leads 44 integrated with the inner leads 42 and extending toward the outside. The die pad 46 is connected to the side rail 45 by tie bars 43. The inner leads 42 and the outer leads 44 are connected to each other and supported by dam bars 47 traversing the inner leads 42 and the outer leads 44, and both terminals of the dam bars 47 are connected to the side rails 45. Although this embodiment of the present invention discloses the lead frame 40 having the inner leads 42 arranged at two sides, a lead frame having inner leads arranged at four sides may be used.

The lead frame 40 is preferably made of Fe alloy or Cu alloy and has a thickness of about 100 mm.

As shown in FIG. 4, the lower tape wiring board 70 of FIG. 2 and the upper tape wiring board 80 are manufactured by photolithography. In the upper tape wiring board 80, the metal patterns 84 and the adhesive layer 86 (not shown) are formed on the lower surface of the polyimide tape 82. The metal patterns 84 are formed by patterning a metal foil attached to the lower surface of the polyimide tape 82. Herein, the metal foil is preferably a Cu foil. A plurality of the windows 83 are formed through the polyimide tape 82. The windows 83 correspond to the electrode pads 22 of the upper chip 20 so that the pad connection portions 87 are exposed from the windows 83. Preferably, the window 83 has a size greater than that of the electrode pad 22. For example, in case of electrode pad 22 having a size of 90~100 mm×90~100 mm and a pitch of 200~250 mm, the window 83 has a size of 100~110 mm×100~110 mm and a pitch of 200~250 mm.

So as to expose the lead connection portions 85 connected to the inner leads 42, portions of the polyimide tape 82 covering the lead connection portions 85 are removed. Then, the adhesive layer (not shown) is formed on the lower surface of the polyimide tape 82 having the metal patterns 84. The adhesive layer is a non-conductive adhesive and attaches the lower surface of the polyimide tape 82 to the active surface of the upper chip 20, and preferably uses a liquid non-conductive adhesive or a double-sided polyimide tape. It is also preferable that the low thermal adhesive layer made of solder comprising Sn and Pb in a rate of approximately 85:15 is formed on the outer surfaces of the lead connection portions 85 in order to more firmly attach to the inner leads 42.

In the tape wiring board 80, the polyimide tape 82 has a thickness of 50~70 mm. The metal patterns 84 has a thickness of 10~20 mm and the adhesive layer has a thickness of 20~50 mm. The lower tape wiring board 70 is the same configuration as the upper tape wiring board 80, thus a manufacturing process of the upper tape wiring board 70 is omitted.

As shown in FIG. 3, the lower chip (10 in FIG. 2) is attached to the lower surface of the die pad 46 and the upper chip 20 is attached to the upper surface of the die pad 46. The lower chip 10 and the upper chip 20 are center pad type chips. Herein, each of the lower chip 10 and the upper chip 20 has a thickness of approximately 200 mm, each of the electrode pads 12, 22 has a size of 90~100 mm×90~100 mm and a pitch of 200~250 mm. The adhesive layer attaching the lower chip 10 and the upper chip 20 to the die pad 46 has a thickness of approximately 20 mm, and is preferably made of an Ag-epoxy adhesive.

As shown in FIG. 4, the lower tape wiring board (70 in FIG. 2) is attached to the active surface of the lower chip (10 in FIG. 2) and the upper wiring board 80 is attached to the active surface of the upper chip 20. These attachments between the chip 10, 20 and the tape wiring board 70, 80 can be carried out separately or concurrently. Herein, the electrode pads 12, 22 are exposed from the windows 73 83 and the lead connection portions 75, 85 correspond to the inner leads 42.

Figure 5:
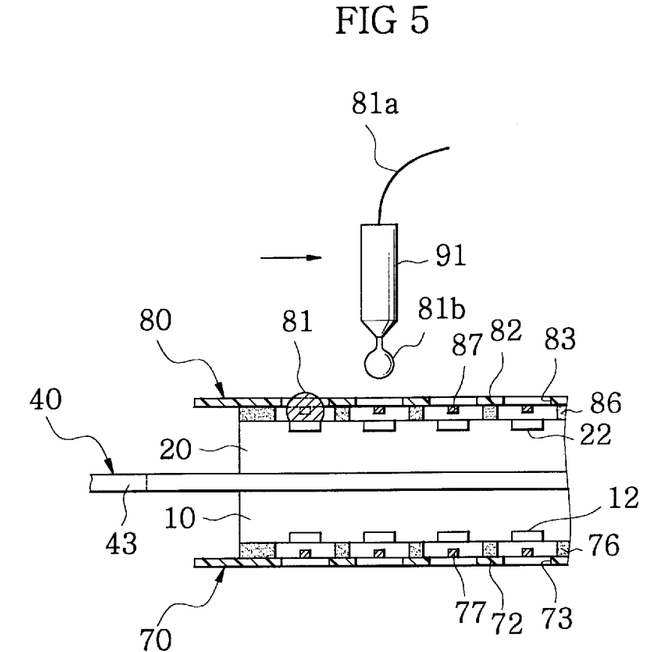
FIG. 5 is a cross-sectional view taken along the line I—I in FIG. 4, which shows electrically connecting each of electrode pads of the upper chip to a respective one of the pad connection portions of the upper tape wiring board by a ball-bonding method.

FIG. 5 shows the electrical connections between the electrode pads 22 of the upper chip 20 and the pad connection portions 87 of the upper tape wiring board 80 by ball bonding method using an Au wire 81a. According to the ball bonding method of the present invention, a capillary 91 is aligned over the window 83 of the upper tape wiring board 80. A ball 81b is then from the wire 81a exposed from the capillary. The pad connection portions 87 are electrically connected to the electrode pads 22 by a pad connection terminal 81 in a ball shape.

After completing the ball-bonding process between the electrode pads 22 of the upper chip 20 and the upper tape wiring board 80, the lead frame 40 is reversed, and the ball-bonding process between the electrode pads 12 of the lower chip 10 and the lower tape wiring board 70 is carried out.

Figure 6:
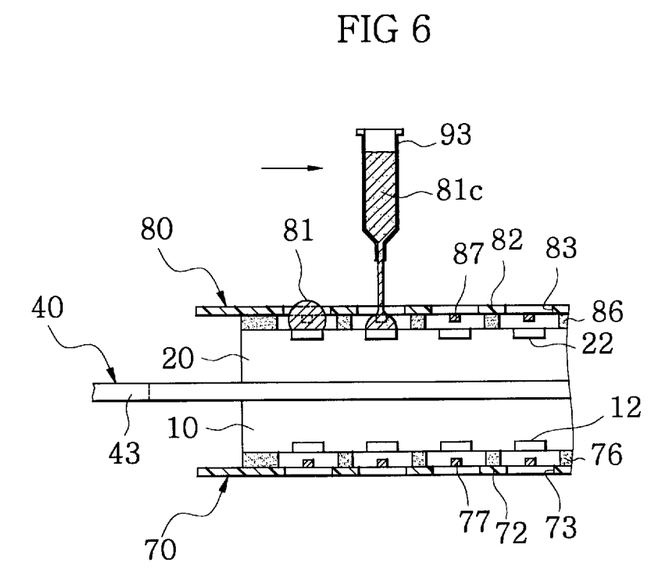
FIG. 6 is a cross-sectional view taken along the line I—I in FIG. 4, which shows electrically connecting each of electrode pads of the upper chip to a respective one of the pad connection portions of the upper tape wiring board by a dotting method.

FIG. 6 shows the electrical connection between the electrode pads 22 of the upper chip 20 and the pad connection portions 87 of the upper tape wiring board 80 by a dotting method using a conductive material 81c. According to the dotting method of the present invention, a dispenser 93 containing the conductive material 81c with a predetermined viscosity, e.g., an about 8,000~14,000 cp is aligned over the window 83 of the upper tape wiring board 80. The conductive material 81c is dotted into the window 83 to electrically connect the pad connection part 87 to the electrode pad 22 by the pad connection terminal 81. It is preferable to use the conductive material 81c with a predetermined viscosity high enough to prevent shorts among the neighboring electrode pads 22.

If an adhesive layer 86 is formed between the neighboring electrode pads 22, the conductive material 81c has broader variations in viscosity.

Figure 7:
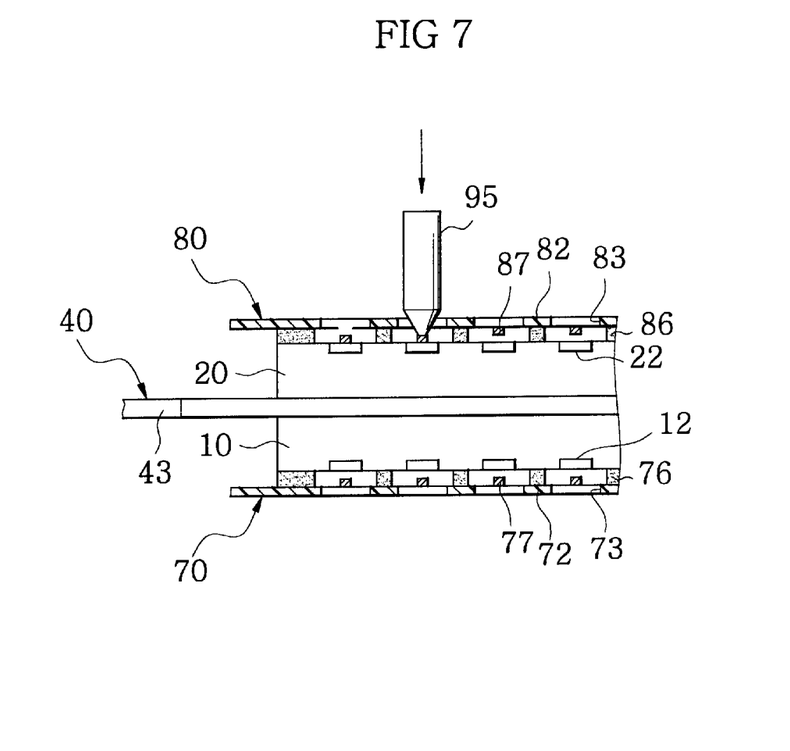
FIG. 7 is a cross-sectional view taken along the line I—I in FIG. 4, which shows electrically connecting each of electrode pads of the upper chip to a respective one of the pad connection portions of the upper tape wiring board by a thermo-compression method.

FIG. 7 shows the electrical connection between the electrode pads 22 of the upper chip 20 and each of the pad connection portions 87 of the upper tape wiring board 80 by a thermocompression method. By the thermocompression method, the pad connection part 87 exposed from the window 83 of the upper tape wiring board 80 is heated and pressed by a first bonding tool 95 to electrically connect the pad connection portions 87 to the electrode pads 22. Although the pad connection portions 87 are electrically connected to the electrode pads 22 by the first bonding tool 95 one by one, a gang bonding tool, which collectively connects a plurality of the pad connection portions 87 to the electrode pads 22 may be used.

Figure 8:
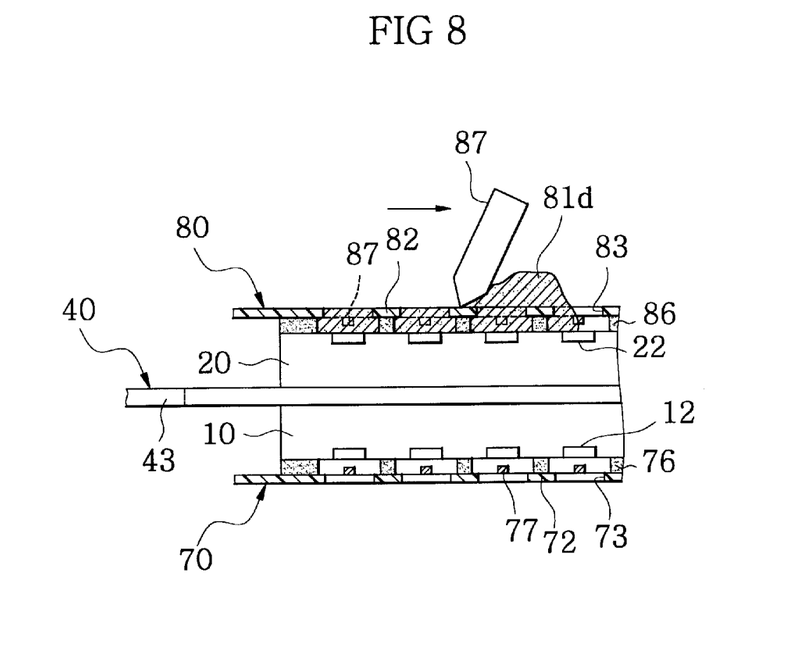
FIG. 8 is a cross-sectional view taken along the line I—I in FIG. 4, which shows electrically connecting each of electrode pads of the upper chip to a respective one of the pad connection portions of the upper tape wiring board by a screen print method.

FIG. 8 shows the electrical connection between the electrode pads 22 of the upper chip 20 and the pad connection portions 87 of the upper tape wiring board 80 by a screen print method. According to the screen print method of the present invention, a metal paste 81d is provided on the upper surface of the upper tape wiring board 80, filling up the window 83 with the metal paste 81d using a squeegee 87. The pad connection terminal is formed by reflowing the metal paste 81d. Herein, Ag-paste is preferably used as the metal paste 81d.

After completing the thermocompression method in FIG. 7, another bonding method in FIG. 5, FIG. 6 or FIG. 7 may be further carried out.

Figure 9:
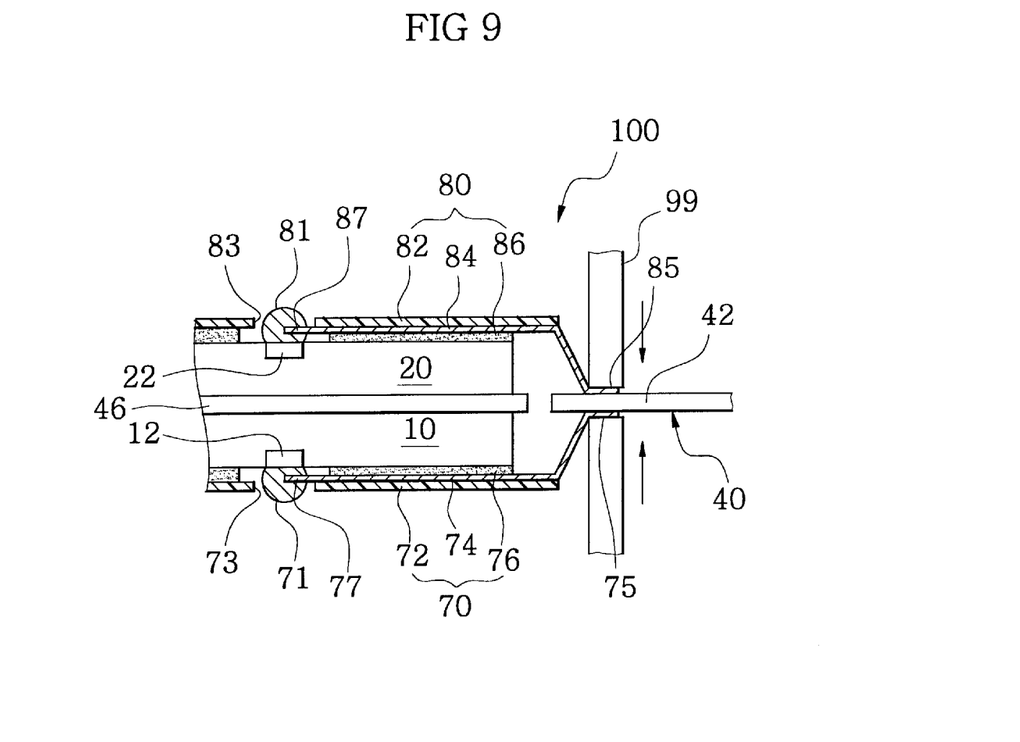
FIG. 9 is a cross-sectional view taken along the line II—II in FIG. 4, which shows electrically connecting each of lead connection portions of the upper tape wiring board to a respective one of the inner leads.

As shown in FIG. 9, the lead connection portions 75, 85 of the lower tape wiring board 70 and the upper tape wiring board 80 are collectively gang bonded to the inner leads 42. The lead connection portions 75, 85 are electrically connected to the inner leads 42 by a thermocompression method using a second bonding tool 99. Herein, the thermocompression method is carried out at the temperature of approximately 250~300° C. and the pressure of approximately 10~50 kgf for 1~3 sec. At this time, a low thermal adhesive layer is formed on the lead connection portions 75, 85, and thereby the lead connection portions 75, 85 are more firmly connected to the inner leads 42. Although these electrical connections between the inner leads and the lead connection portions are collectively achieved, the electrical connections between the inner leads and the lead connection portions may be achieved one-by-one.

Figure 10:
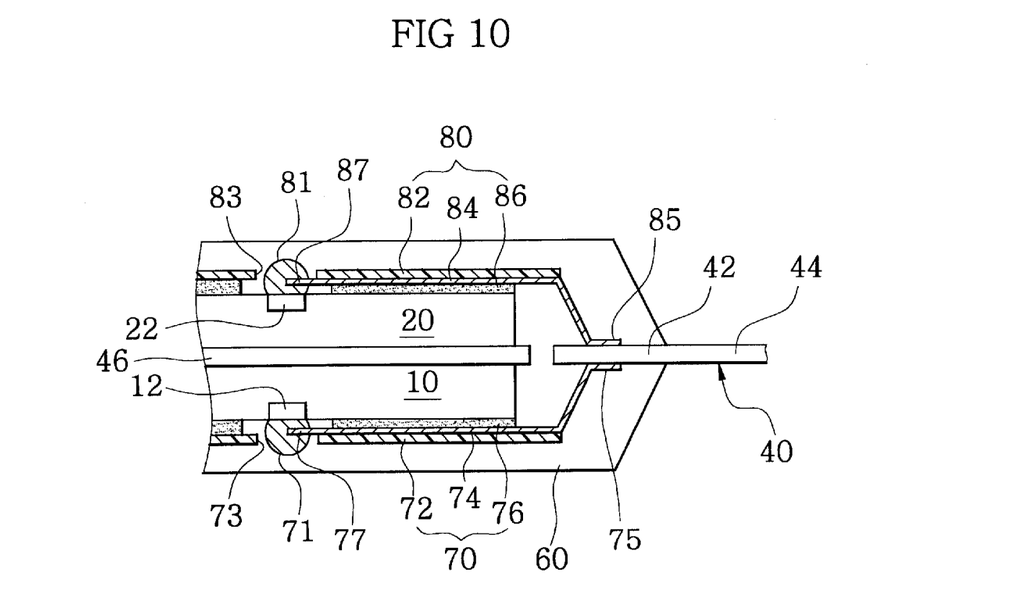
FIG. 10 is a cross-sectional view showing a package body formed by a molding process.

As shown in FIG. 10, the package body 60 is formed. In order to protect the lower chip 10, the upper chip 20, the lower tape wiring board 70, the upper tape wiring board 80, the inner leads 42 and the die pad 46 from external environment, these elements are encapsulated within a molding resin by a transfer mold method to form the package body 60. Preferably, the molding resin is an epoxy molding compound (EMC), and the molding process is carried out at the temperature of 170~200° C. for 40~80 sec.

In a trimming/forming step, the outer leads 44 extruding from the package body 60 are bent to be easily mounted on a substrate, and thereby the dual chip package 100 in FIG. 2 is manufactured.

In accordance with a first embodiment of the present invention, since the dual chip package (DCP) comprises only a single lead frame and the pad connection terminals in bump type instead of the bonding wires, it is possible to reduce the overall thickness of the package. The total thickness of the chips, the lead frame and tape wiring boards is reduced as a thickness of 740~920 mm.

Figure 11:
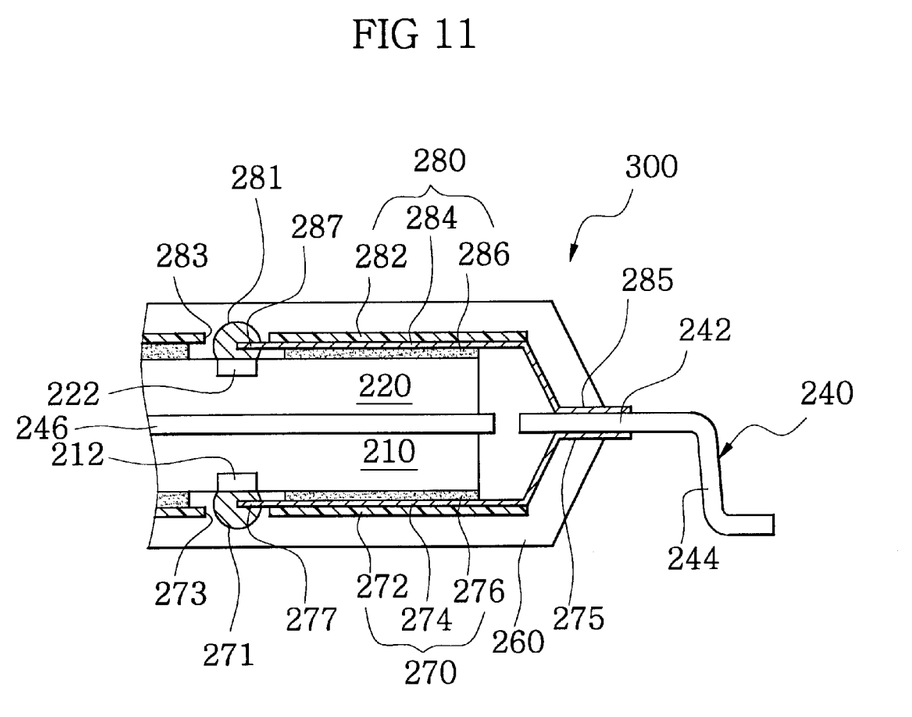
FIG. 11 is a cross-sectional view showing a dual chip package in accordance with another embodiment of the present invention.

Although the first embodiment of the present invention comprises the bonding step of the inner leads 42 and the molding step, which are carried out separately, the two steps may be carried out concurrently. As shown in FIG. 11, during the molding step, lead connection portions 275, 285 are electrically connected to inner leads 242 by using the pressure and the heat of the upper and the lower mold die (not shown). For example, the inner leads bonding step and the molding step are carried out at the temperature of 170~200° C. and the pressure of 80~100 ton for 40~80 sec. Herein, the lead connection portions 275, 285 partially extend outwardly from a package body 260. The configurations of other elements of the second embodiment are the same as those of the first embodiment, and therefore their detail descriptions are omitted.

In accordance with the preferred embodiments of the present invention, two chips are arranged on a single lead frame and the chips are electrically connected to the inner leads of the lead frame by tape wiring boards. Therefore, the dual chip package manufactured by the present invention implements miniaturization by creating a thinner package profile. Further, since the present invention employs only a single lead frame instead of two lead frames, it reduces the production cost.

Although preferred embodiments of the present invention have been described in detail hereinabove, it should be understood that many variations and/or modifications of the basic inventive concepts herein taught which may appear to those skilled in the art will still fall within the spirit and scope of the present invention as defined in the appended claims.

What is claimed is:

1. A method of manufacturing a dual chip package using tape wiring boards, comprising:

(A) preparing an upper tape wiring board, a lower tape wiring board, and a lead frame, wherein each of said tape wiring boards comprises:
a polymeric tape having windows patterned therein, the polymeric tape having a lower and upper surfaces;
metal patterns formed on the lower surface of the polymeric tape at either sides of said windows, said metal patterns having pad connection portions exposed through the window, and lead connection portions extending outwardly from said polymeric tape; and
an adhesive layer formed on the lower surface of the tape;

and wherein said lead frame comprises:
a die pad having a low surface and an upper surface;
a plurality of inner leads extending inwardly toward the die pad; and
a plurality of outer leads integrated with the inner leads and extending outwardly;

(B) attaching a lower chip to the lower surface of the die pad, said lower chip comprising an active surface having a plurality of electrode pads at approximately the center and a rear surface attached to the lower surface of the die pad;

(C) attaching an upper chip to an upper surface of the die pad, said upper chip comprising an active surface having a plurality of electrode pads at approximately the center and a rear surface attached to the upper surface of the die pad;

(D) attaching each of the adhesive layers of the upper tape wiring board and the lower tape wiring board to a respective one of the active surfaces of the upper chip and the lower chip, wherein the windows of the lower and upper tape wiring boards expose the electrode pads of the lower and upper chips, respectively;

(E) electrically connecting each of the pad connection portions to a respective one of the electrode pads; and (F) electrically connecting each of the lead connection portions to a respective one of the inner leads.

2. The method of claim 1, further comprising:

(G) molding the upper chip, the lower chip, the upper wiring board, the lower wiring board and the inner leads to form a package body.

3. The method of claim 1, wherein the step (E) comprises electrically connecting the pad connection portions to the electrode pads by a ball-bonding method using an Au wire.

4. The method of claim 3, wherein the step (E) comprises the sub-steps of:

(E1) electrically connecting each of the pad connection portions of the lower tape wiring board to a respective one of the electrode pads of the lower chip; and (E2) electrically connecting each of the pad connection portions of the upper tape wiring board to a respective one of the electrode pads of the upper chip.

5. The method of claim 1, wherein the step (E) comprises electrically connecting the pad connection portions to the electrode pads by a dotting method using an adhesive material.

6. The method of claim 5, wherein the step (E) comprises the sub-steps of:

(E1) electrically connecting each of the pad connection portions of the lower tape wiring board to a respective one of the electrode pads of the lower chip; and (E2) electrically connecting each of the pad connection portions of the upper tape wiring board to a respective one of the electrode pads of the upper chip.

7. The method of claim 1, wherein the step (E) comprises electrically connecting the pad connection portions to the electrode pads by a thermocompression method.

8. The method of claim 7, wherein the step (E) comprises the sub-steps of:

(E1) electrically connecting each of the pad connection portions of the lower tape wiring board to a respective one of the electrode pads of the lower chip; and (E2) electrically connecting each of the pad connection portions of the upper tape wiring board to a respective one of the electrode pads of the upper chip.

9. The method of claim 1, wherein the step (E) comprises electrically connecting the pad connection portions to the electrode pads by a screen print method.

10. The method of claim 9, wherein the screen print method of step (E) comprises the sub-steps of:
  (i) providing a metal paste on the upper surface of the tape wiring board;
  (ii) filling up the window with the metal paste; and
  (iii) reflowing the metal paste within the window.

11. The method of claim 9, wherein the step (E) comprises the sub-steps of:
  (E1) electrically connecting each of the pad connection portions of the lower tape wiring board to a respective one of the electrode pads of the lower chip; and
  (E2) electrically connecting each of the pad connection portions of the upper tape wiring board to a respective one of the electrode pads of the upper chip.

12. The method of claim 1, wherein the step (F) comprises electrically connecting each of the lead connection portions to a respective one of the inner leads by collectively pressing the lead connection portions of the upper tape wiring board and the lower tape wiring board into the inner leads by using a thermocompression method.

13. The method of claim 1, wherein the polymeric tape is formed of polyimide.

* * * * *